Aug. 2, 1960 D. W. JUNKER 2,947,922

SEMICONDUCTOR DEVICE

Filed Oct. 27, 1958

INVENTOR.
DONALD W. JUNKER
BY
Mason, Kolehmainen, Rathburn, Wyss.
Attys.

2,947,922
Patented Aug. 2, 1960

2,947,922

SEMICONDUCTOR DEVICE

Donald W. Junker, Bloomington, Ind., assignor to Sarkes Tarzian, Inc., Bloomington, Ind., a corporation of Indiana Filed Oct. 27, 1958, Ser. No. 769,656

2 Claims. (Cl. 317—234)

The present invention relates to semiconductor devices and it particularly relates to means for effecting a resilient connection between one side of a semiconductor PN junction and a conductive terminal member.

In order to prevent the application of excessive forces on the fragile semiconductor crystal, some semiconductor devices include a housing for the crystal and a resilient connection between at least one terminal of the device and the crystal. In this manner variations in the initial dimensions of the components of the device as well as changes in those same dimensions resulting from temperature changes are compensated for. Moreover, the resilient connection minimizes the amount of force which may be exerted on the crystal through the terminal.

In copending application, Serial No. 780,747, filed on December 16, 1958, in the name of Ralph R. Miller and assigned to the same assignee as the present invention, there is described a diode including a semiconductor crystal having a metallic dot bonded to one side thereof and having a rigid plastic insulating material coating the exposed surface of the crystal and a substantial portion of the dot. This unidirectional impedance unit including the crystal and associated dot and insulating coating is made by initially bonding the dot to the crystal and thereafter coating the entire dot and associated surface of the crystal with the insulating material while the latter is in a liquid state. With the dot thus entirely coated, the unit is cured to solidify the coating material and the upper portion of the dot and the adjoining portions of the coating are ground off leaving a flat surface including a portion of the dot. Since this flat surface may lie at a substantial angle to a plane perpendicular to the principal axis of the diode along which the associated terminal is disposed, the usual spring connection between the terminal and the dot cannot be used because the spring might engage the insulation rather than the dot.

Accordingly, an object of the present invention is to provide a new and improved arrangement for resiliently connecting one side of a semiconductor unit to a terminal member.

Another object of the present invention is to provide means for insuring a low ohmic connection between a semiconductor member and a contact member which resiliently engages it.

A further object of the present invention is to provide a new and improved semiconductor diode construction.

Another object of the present invention is to provide a new and improved spring contact.

Briefly, the above and further objects are realized in accordance with the present invention by providing a diode which includes a cantilever spring having an integral spherical contact surface thereon for resiliently engaging the unidirectional element of the diode.

The invention both as to its organization and method of operation, together with further objects and advantages thereof, will best be understood by reference to the following specification taken in connection with the accompanying drawings, in which.

Figure 1:
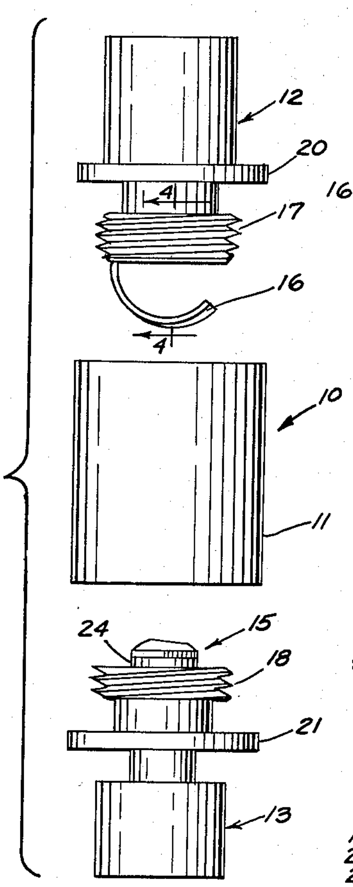
Fig. 1 is an exploded plan view showing a diode embodying the present invention.
Figure 2:
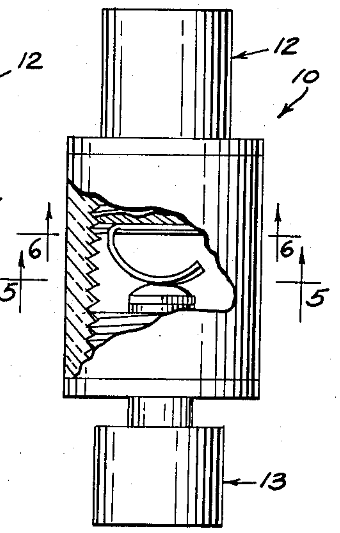
Fig. 2 is a partial sectional view of the diode of Fig. 1 showing the inner portions thereof.

Referring now to the drawings and particularly to Figs. 1 and 2, there is shown a diode 10 comprising as its principal components an insulating sleeve or housing 11, a first terminal member 12, a second terminal member 13, a unidirectional impedance element 15 mounted on the end of the terminal 13, and a spring contact member 16 mounted on the end of the terminal 12. When the diode 10 is assembled, as shown in Fig. 2, portions of the terminal members 12 and 13 extend into the sleeve 11 wherein the spring contact element 16 engages the unidirectional impedance element 15 to connect one side thereof to the terminal member 12. Inasmuch as the other side of the impedance element 15 is connected to the terminal 13, the diode 10 provides a unidirectional impedance between the terminals 12 and 13.

Figure 3:
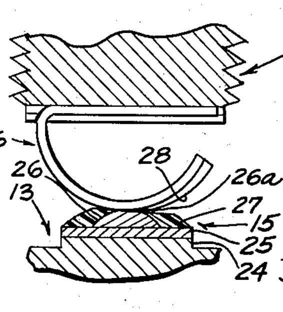
Fig. 3 is an enlarged, fragmentary, cross sectional view showing the connection between the terminal member and the unidirectional impedance element in the diode of Figs. 1 and 2.

Considering the construction of the diode 10 in greater detail, it may be seen that the terminals 12 and 13 include threaded portions 17 and 18, respectively, which are threadedly received in corresponding internal threads in the bore of the sleeve 11, and the terminal members 12 and 13 further include respective flanges 20 and 21 which abut against the ends of the sleeve 11 in the completed diode to effectively seal the chamber within the housing 11 from the surroundings. The unidirectional impedance element 15 is mounted on the end of an axial bore 24 on the terminal 13 and as best shown in Fig. 3 comprises a semiconductor crystal dice 25 which is bonded by an ohmic connection to the boss 24 and on the opposite surface of which is provided a soft metallic dot 26. A PN junction is provided in the semiconductor crystal 25 between the boss 24 and the dot 26. This junction may be formed in accordance with the method described in copending application, Serial No. 570,577, which was filed on March 9, 1956, in the name of George Eannarino and George B. Finn, Jr., and assigned to the same assignee as the present invention. The edge of the PN junction provided in the semiconductor crystal 24 appears on the upper surface of the crystal dice 25 and completely surrounds the dot 26. Therefore, in order to prevent the dot 26 from creeping across the PN junction and thereby short-circuiting it, and moreover, in order to completely seal the exposed edge portion of the PN junction from the surroundings, the lower portion of the dot 26 and the entire upper surface of the crystal 25 are encapsulated in a rigid insulating material 27. The material 27 may be formed of any suitable plastic material which is impervious to the water vapor and which is sufficiently rigid to prevent the cold flow of the dot 26, and the material 27 may be coated on the element 15 in the manner described in the copending Miller application.

As shown, in Fig. 3, the upper surface of the unit 25 is planar but this plane is not necessarily perpendicular to the principal longitudinal axis of the diode although the exposed portion 26a of the dot 26 is partially disposed along this axis.

Very briefly, in making the impedance element 15, the encapsulating material or coating 27 is placed on the crystal dice and associated dot 26 by dipping the upper portion of the unit, as shown in Fig. 3, into a liquid thermo-setting plastic material so that the entire upper surface of the unit is covered with the plastic material. Thereafter, the unit is placed in an oven to cure the plastic thereby rendering it rigid. Since, however, the plastic thus covers the entire upper surface of the dot 26 and would prevent the making of an electrical connection thereto, the upper portion of the encapsulated unit is removed as by a grinding process thus leaving a flat upper portion thereof in which the exposed upper end 26*a* of the dot 26 is located.

In order to connect the terminal member 12 to the exposed upper portion 26*a* of the dot, the spring member 16 is fastened by suitable means, such as staking, to the lower end of the terminal 12 and the lower portion thereof resiliently engages the surface 26*a* of the dot 26. An electrical connection to the dot 26 is insured by the spring 16 even though the flat upper surface of the unit 15 is not perpendicular to the principal longitudinal axis of the diode by virtue of the fact that the lower end portion 28 of the spring 16 is substantially spherical.

Figure 4:
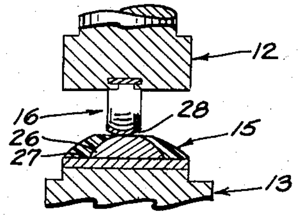
Fig. 4 is a sectional view taken along the line 4—4 of Fig. 1.
Figure 5:
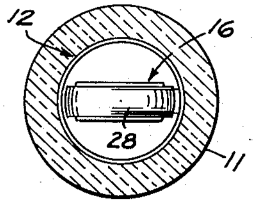
Fig. 5 is a sectional view taken along the line 5—5 of Fig. 2 assuming the entire diode to be shown therein.
Figure 6:
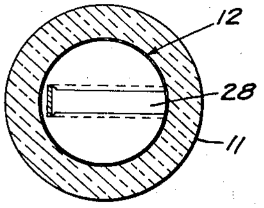
Fig. 6 is a sectional view taken along the line 6—6 of Fig. 2 assuming the entire diode to be shown therein.

In accordance with one aspect of the invention, the spring 16 is a unitary member and, as best shown in Figs. 3 and 4, the bottom portion thereof is so shaped as to present a substantially spherical contact surface for engaging the dot 26. The spring 16 is thus a cantilever type of spring having an integral cylindrical lower surface engaging the one side of the unidirectional impedance element 15 and having the other end thereof connected to the terminal 12 by a good physical and ohmic connection. As the distance between the upper surface 26*a* of the dot and the lower end of the terminal 12 changes due to changes in the temperature of the diode 10, the cylindrical surface 28 on the spring 16 wipes along the upper surface of the dot 26 to maintain a clean area of contact between the spring 16 and the dot 26. While the spring 16 is shown in the illustrated embodiment of the invention as being staked to the terminal 12, it may be expedient in some circumstances to rivet or spot-weld it to the terminal 12.

Inasmuch as the terminals 12 and 13 are screwed into place into the sleeve 11 and are thus necessarily rotated relative to one another, the provision of the complete spherical surface on the lower end of the spring 16, which is provided by deforming the spring in the manner best shown in Fig. 4, the spring may freely rotate relative to the adjoining surface 26*a* of the dot 26 thereby to avoid the establishing of any torsion in the spring 16 which would exert an undesired force on the relatively fragile crystal 25.

While the present invention has been described in connection with a particular embodiment of the invention, it will be understood that various modifications may be made thereon which are within the true spirit and scope of the invention as defined in the appended claims.

What is claimed as new and desired to be secured by Letters Patent of the United States is:

1. A diode comprising a unidirectional impedance element, a first terminal to which one side of said element is connected, a second terminal, a resilient conductive member connected to said second terminal, means responsive to relative rotation of said first and second terminals for moving said resilient member into engagement with the side of said element opposite to said one side, and said resilient conductive member being a cantilever type spring provided with an integral, substantially spherical surface which contacts said unidirectional impedance element.

2. A diode comprising a tubular housing having internal threads in the opposite ends thereof, a first imperforate terminal threadedly positioned in one end of said housing, a second imperforate terminal threadedly positioned in the opposite end of said housing, a rectifying element mounted on the end of said first terminal in said housing, and a conductive spring mounted on the inner end of said second terminal in said housing and resiliently engaging said rectifying element, said rectifying element being so disposed relative to said first and second terminals as to effect a unidirectional impedance therebetween, and said spring being substantially U-shaped with one leg of said U fastened to said second terminal and the other leg of said U providing the engagement with said rectifying element, said other leg of said U-shaped spring comprising an arcuate portion which is substantially spherical.

References Cited in the file of this patent

UNITED STATES PATENTS

| | | |
|---|---|---|
| 2,825,015 | Stineman et al. | Feb. 25, 1958 |
| 2,830,238 | Gudmundsen | Apr. 8, 1958 |
| 2,854,610 | Waters et al. | Sept. 30, 1958 |